United States Patent
Yuasa et al.

(10) Patent No.: US 10,813,212 B2
(45) Date of Patent: Oct. 20, 2020

(54) MULTIBAND FILTER

(71) Applicant: MITSUBISHI ELECTRIC CORPORATION, Tokyo (JP)

(72) Inventors: Takeshi Yuasa, Tokyo (JP); Takeshi Oshima, Tokyo (JP); Hiroyuki Aoyama, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/331,292

(22) PCT Filed: Nov. 8, 2016

(86) PCT No.: PCT/JP2016/083052
§ 371 (c)(1),
(2) Date: Mar. 7, 2019

(87) PCT Pub. No.: WO2018/087802
PCT Pub. Date: May 17, 2018

(65) Prior Publication Data
US 2019/0357348 A1 Nov. 21, 2019

(51) Int. Cl.
H05K 1/02 (2006.01)
H01P 1/203 (2006.01)
(Continued)

(52) U.S. Cl.
CPC ......... H05K 1/0233 (2013.01); H01P 1/2039 (2013.01); H03H 7/01 (2013.01);
(Continued)

(58) Field of Classification Search
CPC .... H05K 1/0233; H05K 1/0243; H05K 1/025; H05K 2201/09227; H05K 2201/09727;
(Continued)

(56) References Cited

U.S. PATENT DOCUMENTS 6,043,725 A 3/2000 Taguchi et al.
6,147,571 A 11/2000 Kitazawa et al.
(Continued)

FOREIGN PATENT DOCUMENTS

| JP | 6-350307 A | 12/1994 |
|----|------------|---------|
| JP | 11-46128 A | 2/1999 |
| JP | 2001-345601 A | 12/2001 |

OTHER PUBLICATIONS

Office Action dated May 20, 2020 in corresponding Eureopean Patent Application No. 16 920 970.7.

*Primary Examiner* — Robert J Pascal
*Assistant Examiner* — Kimberly E Glenn
(74) *Attorney, Agent, or Firm* — Birch, Stewart, Kolasch & Birch, LLP

(57) ABSTRACT

The multiband filter includes a printed circuit board, a first filter, a second filter having an outer dimension different from that of the first filter and passband frequencies higher than those of the first filter, an input terminal, an output terminal, a first inductor, a first capacitor, which are connected except the first capacitor by signal line conductor patterns to form a first transmission line, which connect the second filter, the input terminal, the output terminal, and the first capacitor to form a second transmission line, a part thereof in the first transmission line being arranged in an area on the printed circuit board, formed by the difference between the outer dimensions of the first and the second filters, to achieve desirable passbands and enough attenuation in a suppression band outside the passbands.

13 Claims, 10 Drawing Sheets

(51) Int. Cl.
*H03H 7/01* (2006.01)
*H03H 7/38* (2006.01)
*H03H 7/46* (2006.01)
*H03H 9/64* (2006.01)
*H03H 9/72* (2006.01)

(52) U.S. Cl.
CPC .............. *H03H 7/38* (2013.01); *H03H 7/46* (2013.01); *H03H 9/6406* (2013.01); *H03H 9/72* (2013.01); *H05K 1/025* (2013.01); *H05K 1/0243* (2013.01); *H05K 2201/09227* (2013.01)

(58) Field of Classification Search
CPC .......... H01P 1/2039; H03H 7/01; H03H 7/38; H03H 7/46; H03H 9/6406; H03H 9/72
See application file for complete search history.

(56) References Cited

U.S. PATENT DOCUMENTS

| | | |
|---|---|---|
| 2001/0029241 A1 | 10/2001 | Kayano et al. |
| 2002/0183016 A1 | 12/2002 | Kemmochi et al. |
| 2002/0186092 A1 | 12/2002 | Kayano et al. |

MULTIBAND FILTER

TECHNICAL FIELD

The present invention relates to a multiband filter including multiple filters.

BACKGROUND ART

In an electric circuit and an optical system, a multiband filter having multiple passbands in which multiple filters are connected in parallel, and an inductor and a capacitor are inserted into the input/output unit of each of the filters is used typically when only multiple specific frequency bands are passing. Further, as downsizing of a multiband filter progresses, downsizing of an electric circuit and an optical system is also required. As such a multiband filter, a simple and small-sized filter in which two filters are stacked is proposed (Patent Literature 1).

CITATION LIST

Patent Literature

Patent Literature 1: U.S. Pat. No. 6,147,571 specification (FIGS. 1 and 21)

SUMMARY OF INVENTION

Technical Problem

In the multiband filter of Patent Literature 1, when the amount of attenuation in a suppression band outside passbands does not reach a desired value, an amount of attenuation in the suppression band outside the passbands can be secured by increasing the inductance value of an inductor and the capacitance value of a capacitor which are inserted into the input/output unit of each of the filters.

However, the increase in the inductance value of the inductor and the capacitance value of the capacitor which are inserted results in a collapse of the consistency among the passbands of the multiband filter, and it becomes difficult to form the passbands and it is difficult to achieve both the attainment of an amount of attenuation in the suppression band outside the passbands, and the formation of the passbands.

On the other hand, in a case that a desired value can be attained as the amount of attenuation in the suppression band outside the passbands by increasing the amount of attenuation in a band outside the passband of each of the filters, a problem is that the increase results in an increase in the loss which is caused by an increase in the number of filter stages.

The present invention is made in order to solve the above-mentioned problems, and it is therefore an object of the present invention to provide a technique for achieving both the formation of passbands and the attainment of an amount of attenuation in a suppression band outside the passbands without an increase in the amount of attenuation in a band outside the passband of each filter.

Solution to Problem

In order to solve the above-mentioned problems and achieve the object, a multiband filter of the present invention includes: a printed circuit board on which parts are arranged; a first filter installed on the printed circuit board; a second filter having an outer dimension different from that of the first filter and passband frequencies higher than those of the first filter, and installed on the printed circuit board; an input terminal to which a signal is inputted from an outside; an output terminal via which a signal is outputted to an outside; a first inductor arranged in at least one of space between the input terminal and the first filter, and space between the output terminal and the first filter; a first capacitor arranged in at least one of space between the input terminal and the second filter, and space between the output terminal and the second filter; and signal line conductor patterns for connecting the first filter, the input terminal, the output terminal, and the first inductor, to form a first transmission line, and also connecting the second filter, the input terminal, the output terminal, and the first capacitor, to form a second transmission line, a part thereof belonging to the first transmission line being arranged in an area on the printed circuit board, the area being formed by the difference between the outer dimensions of the first and second filters.

Advantageous Effects of Invention

By using the multiband filter according to the present invention, both the formation of passbands and the attainment of an amount of attenuation in a suppression band outside the passbands can be achieved without an increase in the amount of attenuation in a band outside the passband of each of the filters.

Figure 1A:
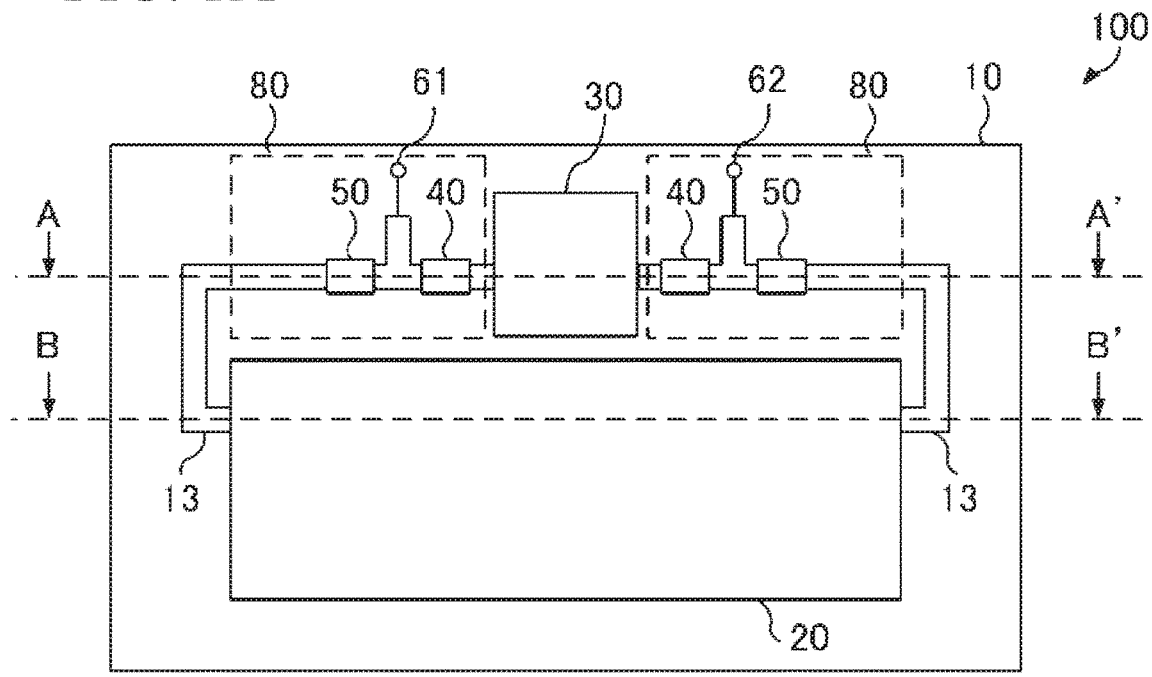
FIG. 1 is a schematic diagram showing an example of a multiband filter in Embodiment 1 of the present invention.

Hereafter, embodiments of a multiband filter according to the present invention will be explained in detail on the basis of the drawings. In the drawings referred to later, the same parts or like parts are denoted by the same reference numerals. The present invention is not limited to those embodiments.

Embodiment 1

Figure 1B:
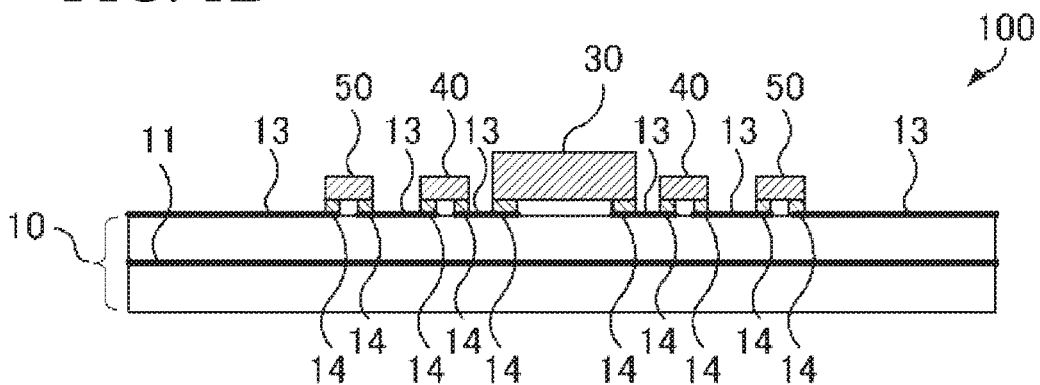
Figure 1C:
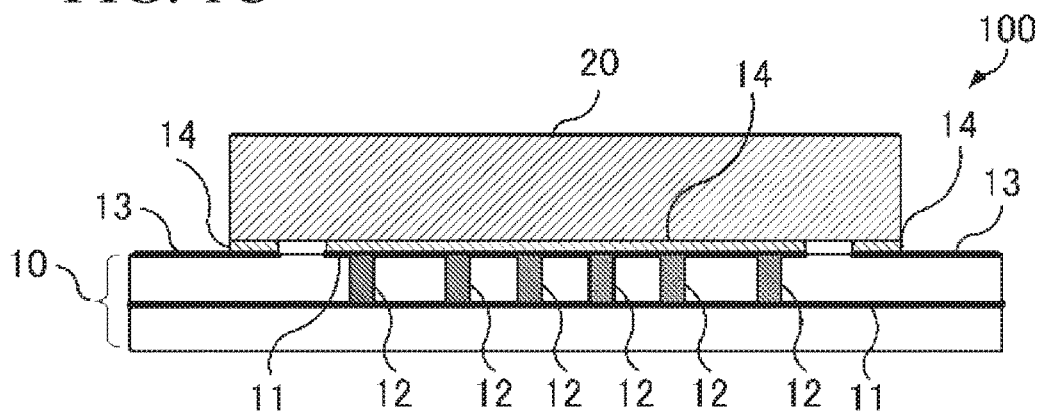

FIG. 1 is a schematic diagram showing an example of a multiband filter according to Embodiment 1 of the present invention. FIG. 1A is a top view, FIG. 1B is a cross-sectional view taken along the A-A' plane in FIG. 1A, and FIG. 1C is a cross-sectional view taken along the B-B' plane in FIG. 1A.

In FIG. 1, the multiband filter 100 includes a printed circuit board 10, ground conductor patterns 11, ground through holes 12, signal line conductor patterns 13, pieces of solder 14, a filter 20, a filter 30, capacitors 40, inductors 50, an input terminal 61, and an output terminal 62.

The printed circuit board 10 is a wiring board in which the ground conductor patterns 11, the ground through holes 12, the signal line conductor patterns 13, the pieces of solder 14, the filter 20, the filter 30, the capacitors 40, the inductors 50, the input terminal 61, and the output terminal 62 are arranged, and is a board made from a typical material, such as a paper phenol board, a paper epoxy board, a glass composite board, or a glass epoxy board.

Each ground conductor pattern 11 is arranged in an outer or inner layer of the printed circuit board 10, and forms a ground in the multiband filter 100. In the inner layer of the printed circuit board 10, a ground conductor pattern 11 can be arranged throughout the printed circuit board 10.

Each ground through hole 12 connects conductor patterns, and places the conductor patterns connected thereby in the same electric potential state. In the multiband filter 100, the ground through holes 12 connect the ground conductor patterns 11, and place the ground conductor patterns 11 connected thereby in the same electric potential state.

The signal line conductor patterns 13 are arranged in the outer layer of the printed circuit board 10, and form a connection among the filter 20, the filter 30, the capacitors 40, the inductors 50, the input terminal 61, and the output terminal 62. Then, the signal line conductor patterns 13 constitute transmission lines together with the ground conductor patterns 11, and form paths through which a signal inputted to the multiband filter 100 flows among the filter 20, the filter 30, the capacitors 40, the inductors 50, the input terminal 61, and the output terminal 62.

The pieces of solder 14 connect the ground conductor patterns 11 and the signal line conductor patterns 13 to the filter 20, the filter 30, the capacitors 40, the inductors 50, the input terminal 61, and the output terminal 62.

The filters 20 and 30 are bandpass filters each having a passband in specific frequencies, and may be filters each including a dielectric coaxial resonator, SAW (Surface Acoustic Wave) filters, or the likes. Here, the passband frequencies of the filter 20 are lower than those of the filter 30, and the filter 20 having lower passband frequencies corresponds to a first filter and the filter 30 having higher passband frequencies corresponds to a second filter.

The capacitors 40 are connected to the filter 30 via signal line conductor patterns 13, and control a path through which a signal flows, the path being in the transmission lines formed by the signal line conductor patterns 13, in combination with the filter 30 connected thereto. Each capacitor 40 corresponds to a first capacitor.

The inductors 50 are connected to the filter 20 via signal line conductor patterns 13, and control a path through which a signal flows, the path being in the transmission lines formed by the signal line conductor patterns 13, in combination with the filter 20 connected thereto. Each inductor 50 corresponds to a first inductor.

The input terminal 61 is a terminal which is connected to an outside and via which a signal is inputted to the multiband filter 100.

The output terminal 62 is a terminal which is connected to an outside and via which a signal is outputted from the multiband filter 100.

Next, the configuration of the connection of the ground conductor patterns 11, the ground through holes 12, the signal line conductor patterns 13, the pieces of solder 14, the filter 20, the filter 30, the capacitors 40, the inductors 50, the input terminal 61, and the output terminal 62 on the printed circuit board 10 will be explained using FIG. 1.

First, a connection relation among the signal line conductor patterns 13, the filter 20, the filter 30, the capacitors 40, the inductors 50, the input terminal 61, and the output terminal 62 on the printed circuit board 10 will be explained using FIG. 1A.

In FIG. 1A, the filter 20, the filter 30, the capacitors 40, the inductors 50, the input terminal 61, and the output terminal 62 are connected via the signal line conductor patterns 13. As a result, a signal inputted from the input terminal 61 is transmitted through the transmission lines formed by the signal line conductor patterns 13 and flows via each of the parts, and is outputted from the output terminal 62.

Here, two parallel paths are formed, as the paths through which a signal flows, between the input terminal 61 and the output terminal 62. First, the first path is one in which the two inductors 50 and the filter 20 are connected in series, and through which a signal flows from the input terminal 61 through the inductors 50, the filter 20, and the other inductor 50 in this order. The second path is one in which the two capacitors 40 and the filter 30 are connected in series, and through which the signal flows from the input terminal 61 through the capacitors 40, the filter 30, and the other capacitor 40 in this order. The transmission line formed by the signal line conductor patterns 13 that form the first path corresponds to a first transmission line, and the transmission line formed by the signal line conductor patterns 13 that form the second path corresponds to a second transmission line.

Next, the configuration of the connection between the filter 30, the capacitors 40, and the inductors 50, and a ground conductor pattern 11 and the signal line conductor patterns 13 will be explained using FIG. 1B.

In FIG. 1B, the ground conductor pattern 11 is arranged in the inner layer of the printed circuit board 10, and forms a grounding. The signal line conductor patterns 13 are arranged throughout among the filter 30, the capacitors 40, and the inductors 50 in the outer layer of the printed circuit board 10, form a discontinuous pattern, and are connected to the parts via pieces of solder 14.

Next, the configuration of the connection between the filter 20, and the ground conductor patterns 11 and the signal line conductor patterns 13 will be explained using FIG. 1C.

In FIG. 1C, the ground conductor patterns 11 are arranged in the inner layer of the printed circuit board 10 and in a part of the outer layer of the printed circuit board 10, the part being located below the filter 20. The ground conductor pattern 11 arranged in the outer layer is connected to the filter 20 via solder 14, and is connected, via the ground through holes 12, to the ground conductor pattern 11 arranged in the inner layer, so that the same electric potential is ensured between them. The signal line conductor patterns 13 are arranged in the outer layer of the printed circuit board 10, and parts of the patterns are arranged to below the filter 20. The signal line conductor patterns 13 are connected to the filter 20 via pieces of solder 14 at points thereof arranged below this filter 20.

Next, an example of the structure of the multiband filter 100 of the present invention will be explained using FIG. 1A. In FIG. 1A, the multiband filter 100 has the structure in which the outer dimensions of the filters 20 and 30 differ and the filter 20 is larger than the filter 30, and the transmission lines formed by the signal line conductor patterns 13, the capacitors 40, and the inductors 50 are arranged in areas 80 which are formed on the printed circuit board 10 by virtue of the difference between the outer dimensions of both the filters.

As a method of causing a difference between the outer dimensions of the filters 20 and 30, there is a method of applying different types of filters. Here, a filter using a dielectric coaxial resonator is applied to the filter 20, and a SAW filter is applied to the filter 30.

By arranging each of the parts in one of the areas 80 formed by virtue of the difference between the outer dimensions of the filters 20 and 30, it becomes possible to arrange the filter 30, the capacitors 40, and the inductors 50 in a row along an identical direction, and downsize the multiband filter 100.

Further, by forming the areas 80 on the printed circuit board 10, an area in which the user is allowed to arrange the signal line conductor patterns 13 on the printed circuit board 10 can be sufficiently secured, and the user can easily form the transmission lines each having a required length.

Further, because each of the parts is arranged in one of the areas 80 formed by virtue of the difference between the outer dimensions of the filters 20 and 30 in the multiband filter 100, the signal line conductor pattern 13 that forms the transmission line of the first path through which the signal flows via the input terminal 61, the filter 20, and the output terminal 62 can be arranged with a line length longer than that of the signal line conductor pattern 13 that forms the transmission line of the second path which connects the input terminal 61, the filter 30, and the output terminal 62 and through which the signal flows.

The purpose of causing the line lengths of the transmission lines formed by the signal line conductor patterns 13 to differ between the first path and the second path is to control the phase of the signal flowing through the filter 20 or 30. By forming the first path in such a way that the first path is longer than the second path, the phase of the signal flowing through the filter 20 having a lower passband than that of the filter 30 can be delayed, in a high frequency range, with respect to the signal flowing through the filter 30, and a phase difference can be provided, so that the multiband filter 100 can increase the amount of suppression in a suppression band.

With this arrangement, also in a case in which the amount of attenuation in the suppression band outside the passbands does not reach a desired value, the multiband filter 100 can provide a required amount of attenuation without increasing the inductance value of an inductor and the capacitance value of a capacitor which are inserted into the input/output unit of each of the filters, and without increasing the amount of attenuation in a band outside the passband of each of the filters.

Therefore, the multiband filter 100 can provide an advantage of being able to prevent an increase in the loss due to both a collapse of the consistency among the passbands and an increase in the number of filter stages in each of the filters, while attaining an amount of attenuation in the suppression band outside the passbands.

Further, the multiband filter 100 can also provide an advantage of enabling the user to easily design the multiband filter because the multiband filter can control the passbands and the suppression band by using the transmission lines formed by the arrangement of the signal line conductor patterns 13.

Figure 2A:
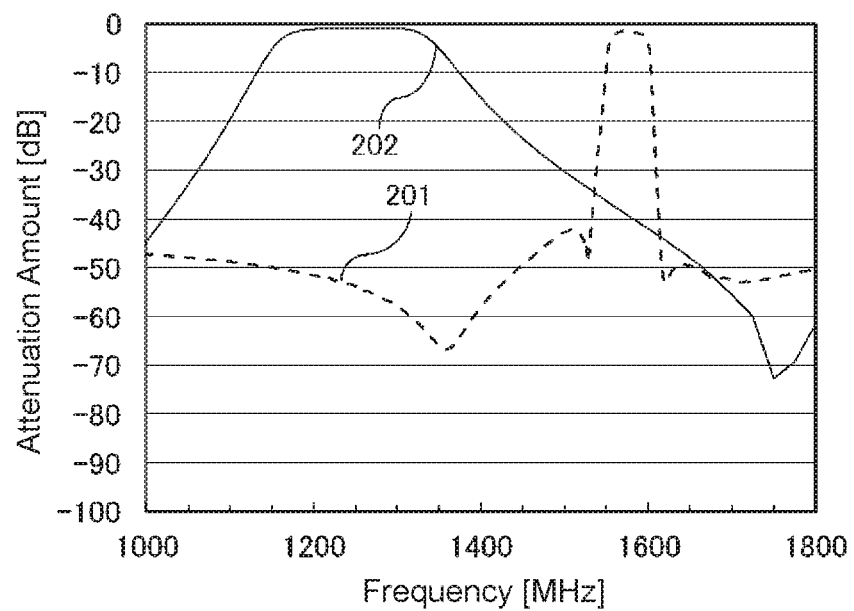
FIG. 2 is an explanatory diagram showing an example of the frequency pass characteristic of the multiband filter in Embodiment 1 of the present invention.
Figure 2B:
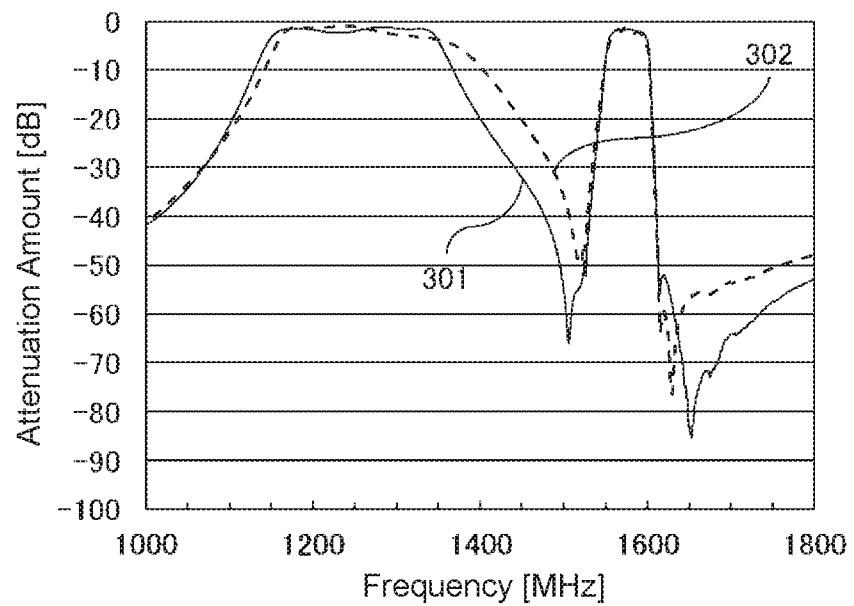

Next, the frequency pass characteristic of the multiband filter 100 will be explained using FIG. 2. FIG. 2 is the explanatory diagram showing an example of the frequency pass characteristic of the multiband filter in Embodiment 1 of the present invention. FIG. 2A is a measured result of the frequency characteristics of the single filters 20 and 30, and FIG. 2B is results of electromagnetic field simulation of the substrate pattern characteristics of a conventional multiband filter 900 and the multiband filter 100, the substrate pattern characteristics being calculated in circuit simulation.

Here, the frequency passband of the filter 20 is in the range from approximately 1,150 MHz to 1,350 MHz, and the frequency passband of the filter 30 is in the range from approximately 1,550 MHz to 1,600 MHz. Further, the multiband filter is designed in such a way as to have the above-mentioned two bands as the passbands, a range of approximately 1,500 MHz between the passbands as the suppression band, and a target suppression value as −50 dB.

Figure 10:
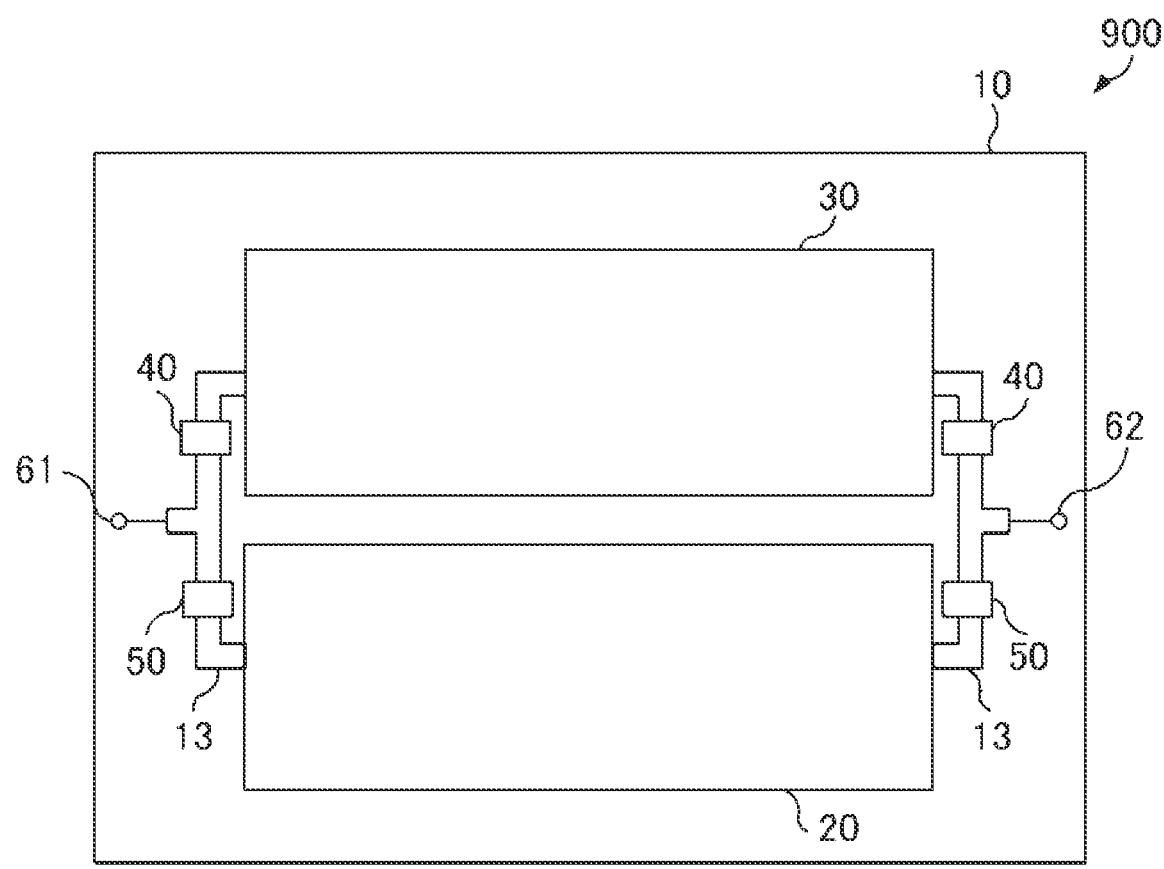
FIG. 10 is a schematic diagram showing an example of a conventional multiband filter.

It is assumed that the conventional multi-filter 900 has a structure shown in FIG. 10. FIG. 10 is a schematic diagram showing an example of the structure of the conventional multiband filter. The conventional multiband filter 900 includes a printed circuit board 10, ground conductor patterns 11, ground through holes 12, signal line conductor patterns 13, pieces of solder 14, a filter 20, a filter 30, capacitors 40, inductors 50, an input terminal 61, and an output terminal 62, like the multiband filter 100 of the present invention. Because each of the parts is the same as that of the multiband filter 100 of the present invention, an explanation of the parts will be omitted hereafter, and, because FIG. 10 is a top view, an illustration of the ground conductor pattern 11, the ground through holes 12, and the pieces of solder 14 is omitted.

Here, the conventional multiband filter 900 differs from the multiband filter 100 in that the outer dimensions of the filters 20 and 30 are the same, and the lengths of first and second paths of transmission lines formed by the signal line conductor patterns 13 are the same.

In the electromagnetic field simulation in FIG. 2, the calculation is performed by assuming that in the conventional multiband filter 900, the two capacitors each having a capacitance value of 2.5 pF, the two inductors each having an inductance value of 6.5 nH, and the signal line conductor patterns that form the transmission lines in which the first and second paths have the same length and each of the paths has a path length of 3 mm are arranged.

Further, the calculation is performed by assuming that as the multiband filter 100, the two capacitors each having a capacitance value of 10 pF, the two inductors each having an inductance value of 5.2 nH, and the signal line conductor patterns that form the transmission lines in which the first path has a path length of 20 mm and the second path has a path length of 3 mm are arranged.

In FIG. 2A, the horizontal axis shows the frequency (MHz) and the vertical axis shows the amount of attenuation (dB). Here, the horizontal axis shows a range from 1,000 to 1,800 MHz.

A solid line 201 shows a measured result of the frequency characteristic of the filter 20, and a broken line 202 shows a measured result of the frequency characteristic of the filter 30. In the measured result of the filter 20, the amount of attenuation is small in the frequency range from 1,150 to 1,350 MHz which is the passband, and the amount of attenuation becomes larger as the frequency deviates from the passband. In the measured result of the filter 30, the amount of attenuation becomes small rapidly in the frequency range from approximately 1,550 MHz to 1,600 MHz which is the passband, and the amount of suppression is large in the other frequencies.

Results of having performed the electromagnetic field simulation of the conventional multiband filter 900 and the multiband filter 100 by using the filters having these frequency characteristics are shown in FIG. 2B.

In FIG. 2B, the horizontal axis shows the frequency (MHz), and the vertical axis shows the amount of suppression (dB). Here, the horizontal axis shows a range from 1,000 MHz to 1,800 MHz. A solid line 301 shows a result of the electromagnetic field simulation of the multiband filter 100 of the present invention, and a broken line 302 shows a result of the electromagnetic field simulation of the conventional multiband filter 900.

It is seen from FIG. 2B that the conventional multiband filter 900 cannot achieve a desired value of −50 dB in the amount of suppression at the frequency of 1,500 MHz which is the suppression band. This shows that the attenuation characteristic of each of the filters in the suppression band cannot be attained sufficiently because the suppression band is close to the passbands. Further, in the higher part of passband of 1,150 MHz to 1,350 MHz, degradation of the pass characteristic occurs in the conventional multiband filter 900. This shows that the conventional multiband filter 900 needs an increase in the inductance values of the inductors in order to form the suppression band, and the passbands collapse under this influence. As mentioned above, in the conventional multiband filter 900, it is difficult to achieve both the formation of the passbands and the attainment of an amount of attenuation in the suppression band outside the passbands.

In contrast, in the multiband filter 100, no degradation occurs in the pass characteristic in both the frequency range from 1,150 MHz to 1,350 MHz and the frequency range from 1,500 MHz to 1,600 MHz which are the passbands, and a desired amount of suppression of −50 dB is also achieved at the frequency of 1,500 MHz which is the suppression band. The reason why no degradation in the passband characteristic occurs in this case is that in the multiband filter 100 of the present invention, because the first path of the transmission lines formed by the signal line conductor patterns can be arranged with a long line length, and each of the inductors 40 can be arranged with a smaller inductance value than that of the conventional multiband filter 100, a collapse of the consistency among the passbands does not occur.

As mentioned above, in the multiband filter 100 of the present invention, because the transmission lines formed by the signal line conductor patterns 13, the capacitors 40, and the inductors 50 are arranged in the areas 80 on the printed circuit board 10 which are formed by virtue of the difference between the outer dimensions of the filters 20 and 30, both the formation of the passbands and the attainment of an amount of attenuation in the suppression band outside the passbands can be easily achieved.

As mentioned above, according to the multiband filter 100 of Embodiment 1, by arranging signal line conductor patterns in the areas on the printed circuit board which are formed by virtue of the difference between the outer dimensions of the two filters arranged, and forming the first path of the transmission lines, there is provided an advantage of being able to achieve both the formation of the passbands and the attainment of an amount of attenuation in the suppression band outside the passbands.

Further, by arranging the signal line conductor patterns in such a way that the line length of the first path of the transmission lines is longer than that of the second path, and causing a phase difference in a signal flowing through the first filter, there is provided an advantage of being able to increase the amount of suppression in the suppression band of the multiband filter 100 of Embodiment 1.

Further, by making the first filter larger than the second filter, and arranging the second filter, the first inductors, and the first capacitors in a row along an identical direction, there is provided an advantage of being able to downsize the multiband filter 100 of Embodiment 1.

Although the case in which the filter 30, the capacitors 40, and the inductors 50 are arranged in a row along an identical direction as the multiband filter 100 that can provide the advantage of further downsizing is explained, the embodiments are not limited to this example, and the capacitors 40 and the inductors 50 can be arranged in such a way that they are connected to signal line conductor patterns 13 extending in different directions. Also in this case, because the signal line conductor patterns can be arranged in the areas 80 and transmission lines can be formed in the areas 80, there is provided an advantage of being able to achieve downsizing as compared with a case in which no transmission line can be formed.

Although the case in which the two capacitors 40 and the two inductors 50 are arranged as the multiband filter 100 is explained, the embodiments are not limited to this example, and only one capacitor 40 or three or more capacitors 40 and only one inductor 50 or three or more inductors 50 can be arranged. In the case in which only one capacitor 40 and only one inductor 50 are arranged, there is provided an advantage of being able to reduce the number of parts, and in the case in which three or more capacitors 40 and three or more inductors 50 are arranged, there is provided an advantage of being able to reduce the capacitance of each of the capacitors and the inductance of each of the inductors.

Although the case in which the outer dimension of the filter 20 is larger than that of the filter 30 in the multiband filter 100 shown in FIGS. 1 and 2 is explained, the embodiments are not limited to this example, and the outer dimension of the filter 30 can be larger than that of the filter 20. More specifically, what is necessary is just to be able to form the areas 80, on the printed circuit board 10, in which signal line conductor patterns can be arranged in such a way that the lengths of the first and second paths of the formed transmission lines differ, by causing a difference between the outer dimensions of the filters constituting the multiband filter 100.

Figure 3:
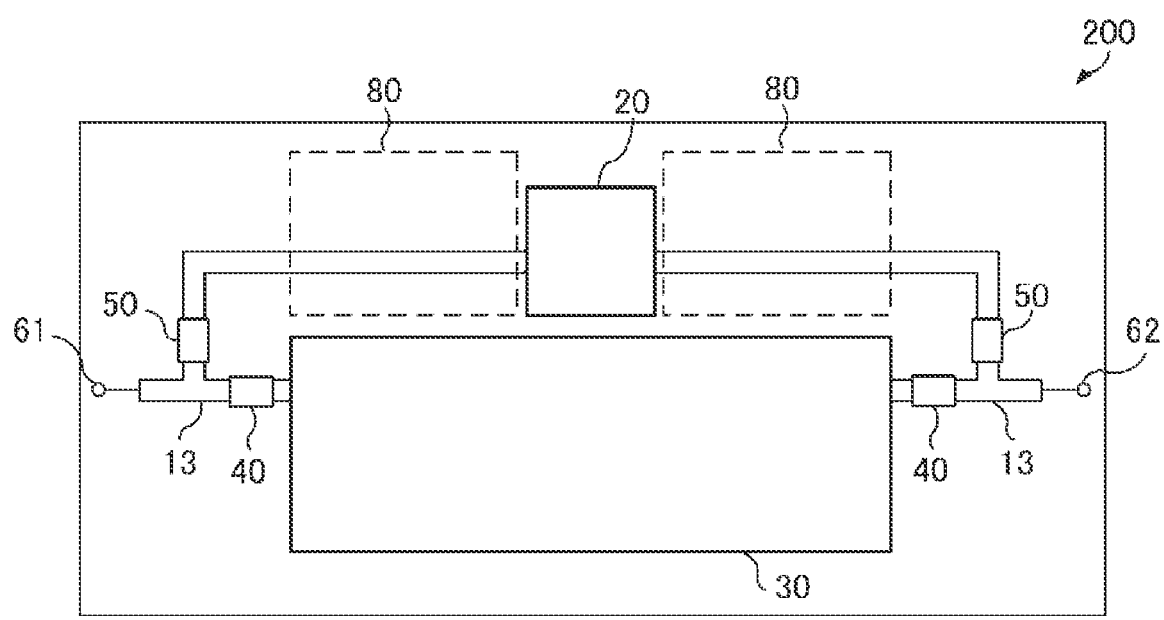
FIG. 3 is a schematic diagram showing an example of the multiband filter in Embodiment 1 of the present invention.

The structure of a multiband filter 200 in which a filter 30 has a larger outer dimension than a filter 20 will be explained using FIG. 3. FIG. 3 is a schematic diagram showing an example of the multiband filter in Embodiment 1 of the present invention.

The multiband filter 200 includes a printed circuit board 10, ground conductor patterns 11, ground through holes 12, signal line conductor patterns 13, pieces of solder 14, the filter 20, the filter 30, capacitors 40, inductors 50, an input terminal 61, and an output terminal 62, like the multiband filter 100 of the present invention. Because each of the parts is the same as that of the multiband filter 100 of the present invention, an explanation of the parts will be omitted. Further, because a cross-sectional view showing a connection relation between each of the parts and the printed circuit board 10 is also the same as that of the multiband filter 100 of Embodiment 1, an explanation of the relation will be omitted. Therefore, an illustration of the ground conductor patterns 11, the ground through holes 12, and the pieces of solder 14 is omitted.

In FIG. 3, in the multiband filter 200, areas 80 are formed by virtue of the difference between the outer dimensions of the filters 20 and 30, like in the case of the multiband filter 100. Here, in the multiband filter 200, the signal line conductor patterns 13 that form a first path are arranged in the areas 80, unlike in the case of the multiband filter 100. This is because the filter 20 has lower passband frequencies than the filter 30, and a phase difference in a signal flowing through the filter 20 is caused to increase the amount of suppression in the suppression band.

Although in FIG. 3, the case in which the parts arranged in the areas 80 of the multiband filter 200 are only the signal line conductor patterns that form the transmission line which is the first path is explained, the embodiments are not limited to this example, and the inductors 50, the capacitors 40, and the signal line conductor patterns that forma transmission line which is a second path can be arranged on the basis of required design.

Embodiment 2

In Embodiment 2, an embodiment in which parts of the transmission lines formed by the signal line conductor patterns 13 arranged in the multiband filter 100 in Embodiment 1 are low impedance lines will be explained.

Figure 4:
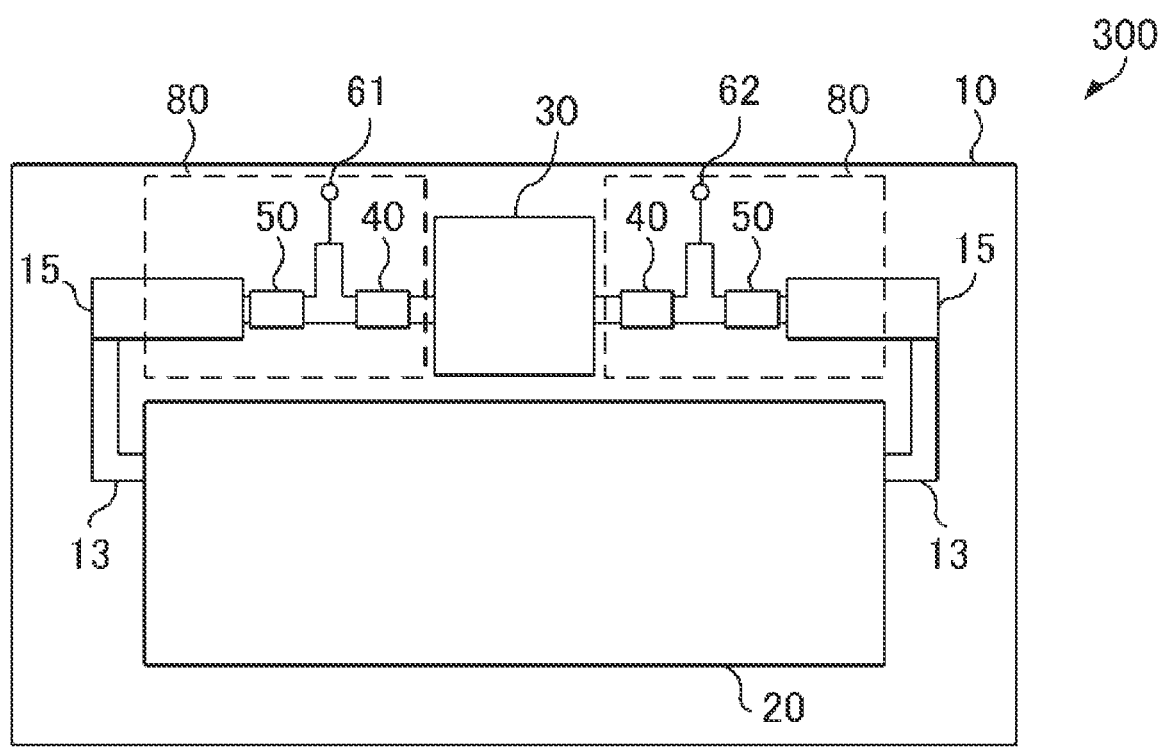
FIG. 4 is a schematic diagram showing an example of a multiband filter in Embodiment 2 of the present invention.

FIG. 4 is a schematic diagram showing an example of a multiband filter in Embodiment 2 of the present invention. In FIG. 4, the multiband filter 300 has a structure in which parts of the signal line conductor patterns 13 of the multiband filter 100 in Embodiment 1 are signal line conductor patterns 15.

Here, because a printed circuit board 10, signal line conductor patterns 13, a filter 20, a filter 30, capacitors 40, inductors 50, an input terminal 61, and an output terminal 62 are the same as those of the multiband filter 100, an explanation of the parts will be omitted. Further, because a cross-sectional view showing a connection relation between each of the parts and the printed circuit board 10 is also the same as that of the multiband filter 100 of Embodiment 1, an explanation of the relation will be omitted. Therefore, an illustration of ground conductor patterns 11, ground through holes 12, and pieces of solder 14 is omitted.

In FIG. 4, the signal line conductor patterns 15 are conductor patterns each having a thicker pattern width than those of the signal line conductor patterns 13, and are connected to the inductors 50. Therefore, the transmission lines formed by the signal line conductor patterns 15 have lower impedance than that of the transmission lines formed by the signal line conductor patterns 13. Here, the signal line conductor patterns 15 are arranged with a thickness of a pattern width which makes the characteristic impedance of the transmission lines formed by the signal line conductor patterns 15 lower than that of the input terminal 61 and that of the output terminal 62.

By arranging the signal line conductor patterns in this way, the series inductance components provided by the inductors 50 can be reduced by the shunt capacitance components provided by the transmission lines formed by the signal line conductor patterns 15 which are low impedance lines, degradation in the consistency among the passbands of the multiband filter 300 can be prevented, and the insertion loss level of the passbands can be improved.

As mentioned above, according to the multiband filter 300 of Embodiment 2, by forming the parts of the signal line conductor patterns which are connected to the inductors into signal line conductor patterns each having a thick pattern width, there is provided an advantage of being able to form transmission lines which are low impedance lines and improve the insertion loss level of the passbands.

Although the case in which the transmission lines that are low impedance lines in the multiband filter 300 are parts of the entire transmission lines is explained, the embodiments are not limited to this example, and low impedance lines can be formed throughout between the inductors 50 and the filter 20.

Although a method of thickening the pattern widths of signal line conductor patterns is explained as a method of forming the transmission lines which are low impedance lines in the multiband filter 300, the embodiments are not limited to this example, and the transmission lines can be formed into low impedance lines by bringing the ground conductor patterns 11 forming a grounding close to the signal line conductor patterns 13.

Embodiment 3

In Embodiment 3, an embodiment in which shunt capacitance is added to between each of the inductors 50 and the filter 20 in the multiband filter 100 in Embodiment 1 will be explained.

Figure 5A:
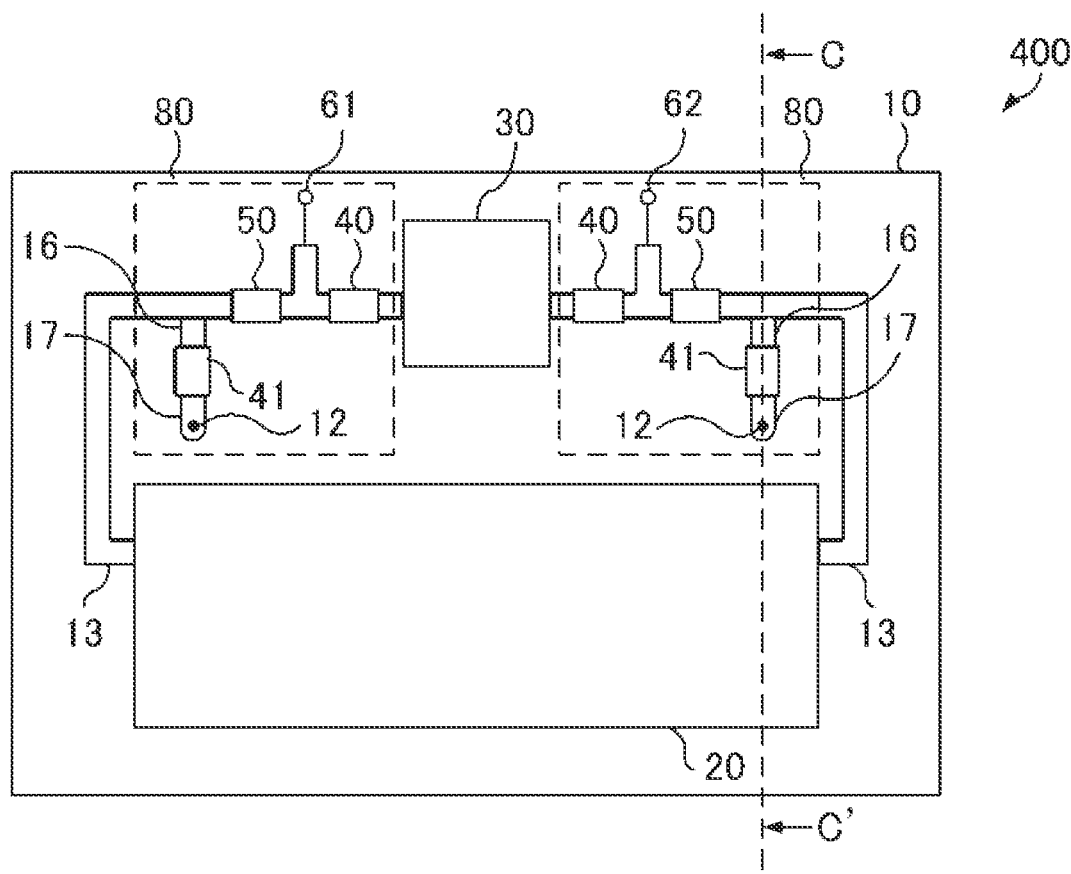
FIG. 5 is a schematic diagram showing an example of a multiband filter in Embodiment 3 of the present invention.
Figure 5B:
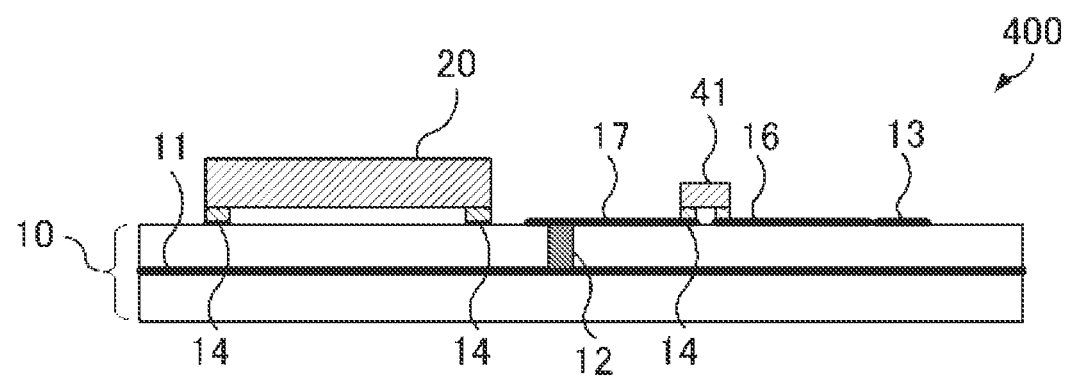

FIG. 5 is a schematic diagram showing an example of a multiband filter in Embodiment 3 of the present invention. FIG. 5A is a top view, and FIG. 5B is a cross-sectional view taken along the plane C-C' in FIG. 5A. In FIG. 5, the multiband filter 400 has a structure in which signal line conductor patterns 16 branching from signal line conductor patterns 13 each arranged between an inductor 50 and the filter 20 of the multiband filter 100 in Embodiment 1, capacitors 41 connected to the signal line conductor patterns 16, signal line short circuiting conductor patterns 17 connected to the capacitors 41, and ground through holes 12 connected to the signal line short circuiting conductor patterns 17 are added.

Here, because a printed circuit board 10, the ground through holes 12, the signal line conductor patterns 13, the filter 20, a filter 30, capacitors 40, the inductors 50, an input terminal 61, and an output terminal 62 are the same as those of the multiband filter 100, an explanation of the parts will be omitted.

In FIG. 5, the signal line conductor patterns 16 branch from the signal line conductor patterns 13, and form transmission lines together with the ground conductor patterns 11, like the signal line conductor patterns 13. The transmission lines formed by the signal line conductor patterns 16 correspond to third transmission lines. Although in FIG. 5, the signal line conductor patterns 16 are illustrated separately from the signal line conductor patterns 13 for the sake of explanation, the signal line conductor patterns 16 can be constituted integrally with the signal line conductor patterns 13.

The signal line short circuiting conductor patterns 17 are electrically connected, via the ground through holes 12, to the ground conductor pattern 11 arranged in an inner layer, and form short circuit parts short-circuited to a ground.

The capacitors 41 are connected to the signal line conductor patterns 16 and the signal line short circuiting conductor patterns 17 and are grounded to the ground via the ground conductor pattern 11, the ground through holes 12, and the signal line short circuiting conductor patterns 17, and form shunt capacitance. The capacitors 41 correspond to second capacitors.

By using the shunt capacitance formed by the capacitors 41, the ground through holes 12, the signal line conductor patterns 16, and the signal line short circuiting conductor patterns 17 which are mentioned above, the multiband filter 400 can reduce the series inductance components provided by the inductors 50, prevent degradation in the consistency among the passbands of the multiband filter 400, and improve the insertion loss level of the passbands.

Further, in FIG. 5, the ground through holes 12, the signal line conductor patterns 16, the signal line short circuiting conductor patterns 17, and the capacitors 41 are arranged in inside areas surrounded by the signal line conductor patterns 13 forming the transmission line of a first path, the signal line conductor patterns 13 forming the transmission line of a second path, and the filters 20 and 30.

By arranging the parts in this way, the space on the printed circuit board 10 can be used effectively, and the multiband filter 400 can be downsized.

As mentioned above, according to the multiband filter 400 of Embodiment 3, by connecting the shunt capacitance formed by the capacitors, the ground through holes, the signal line conductor patterns, and the signal line short circuiting conductor patterns between the inductors 50 and the filter 20, there is provided an advantage of being able to improve the insertion loss level of the passbands.

Further, by arranging the capacitors, the ground through holes, the signal line conductor patterns, and the signal line short circuiting conductor patterns, forming the shunt capacitance, in the areas surrounded by the signal line conductor patterns 13 forming the transmission line of the first path, the signal line conductor patterns 13 forming the transmission line of the second path, and the filters 20 and 30, there is also provided an advantage of being able to downsize the multiband filter 400 of Embodiment 3.

Embodiment 4

In Embodiment 4, an embodiment in which inductors are added between the branch points between the signal line conductor patterns 13 and the signal line conductor patterns 16, and the filter 20 in the multiband filter 400 in Embodiment 3 will be explained.

Figure 6:
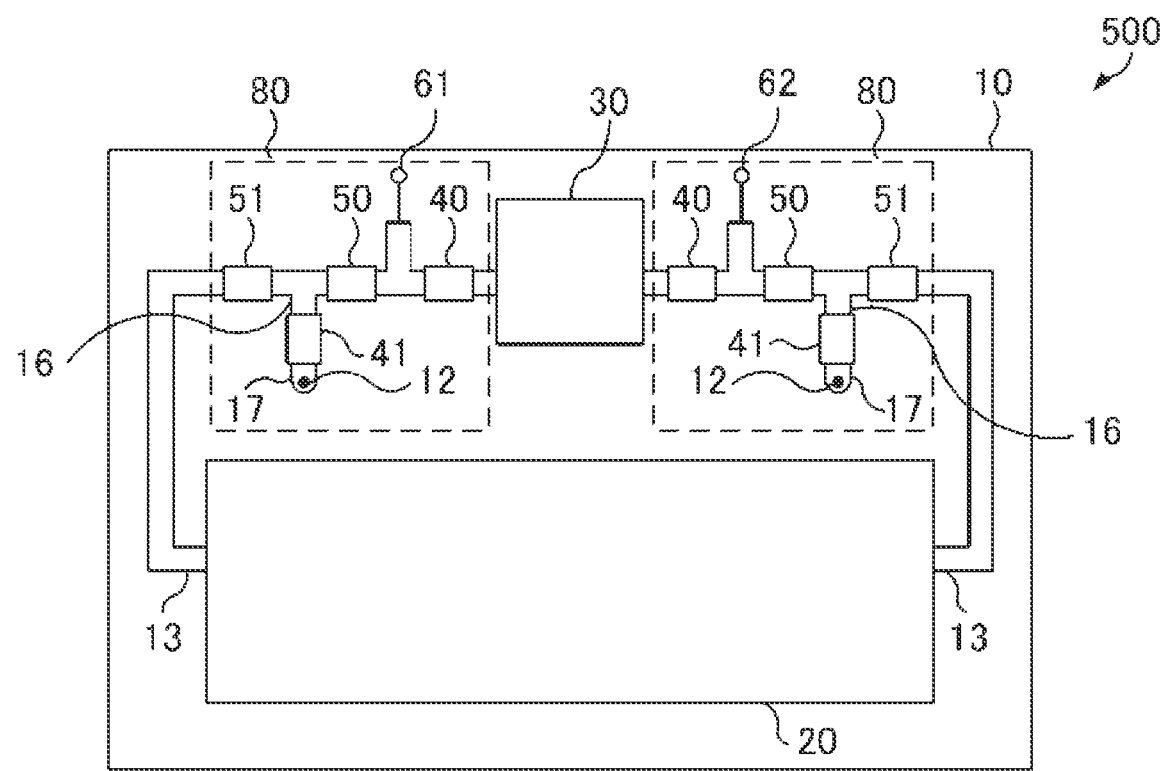
FIG. 6 is a schematic diagram showing an example of a multiband filter in Embodiment 4 of the present invention.

FIG. 6 is a schematic diagram showing an example of a multiband filter in Embodiment 4 of the present invention. In FIG. 6, the multiband filter 500 has a structure in which inductors 51 are added between the branch points between the signal line conductor patterns 13 and the signal line conductor patterns 16, and the filter 20 in the multiband filter 300 of Embodiment 3.

Here, a printed circuit board 10, ground through holes 12, the signal line conductor patterns 13, the filter 20, a filter 30, capacitors 40, inductors 50, an input terminal 61, and an output terminal 62 are the same as those of the multiband filter 100 in Embodiment 1, and the signal line conductor patterns 16, signal line short circuiting conductor patterns 17, and capacitors 41 are the same as those of the multiband filter 400 in Embodiment 3, an explanation of the parts will be omitted. Further, because a cross-sectional view showing a connection relation between each of the parts and the printed circuit board 10 is also the same as that of the multiband filter 100 of Embodiment 1, an explanation of the relation will be omitted. Therefore, an illustration of ground conductor patterns 11, the ground through holes 12 below the filter 20, and pieces of solder 14 is omitted.

In FIG. 6, the inductors 51 are connected to the signal line conductor patterns 13 in such a way as to constitute T-type circuits together with the capacitors 41 and the inductors 50. The inductors 51 correspond to second inductors of the present invention.

By using the T-type circuits constituted by the capacitors 41, the inductors 50, and the inductors 51 which are mentioned above, the multiband filter 500 can reduce the series inductance components provided by the inductors 50, prevent degradation in the consistency among the passbands of the multiband filter 500, and improve the insertion loss level of the passbands.

As mentioned above, according to the multiband filter 500 of Embodiment 4, the T-type circuits can be formed by connecting the inductors between the branch points between the signal line conductor patterns 13 and the signal line conductor patterns 16, and the filter 20, and there is provided an advantage of being able to improve the insertion loss level of the passbands.

Embodiment 5

In Embodiment 5, an embodiment of a multiband filter in which a filter 31 and capacitors 42 are added to the multiband filter 100 in Embodiment 1 and which includes three filters will be explained.

Figure 7:
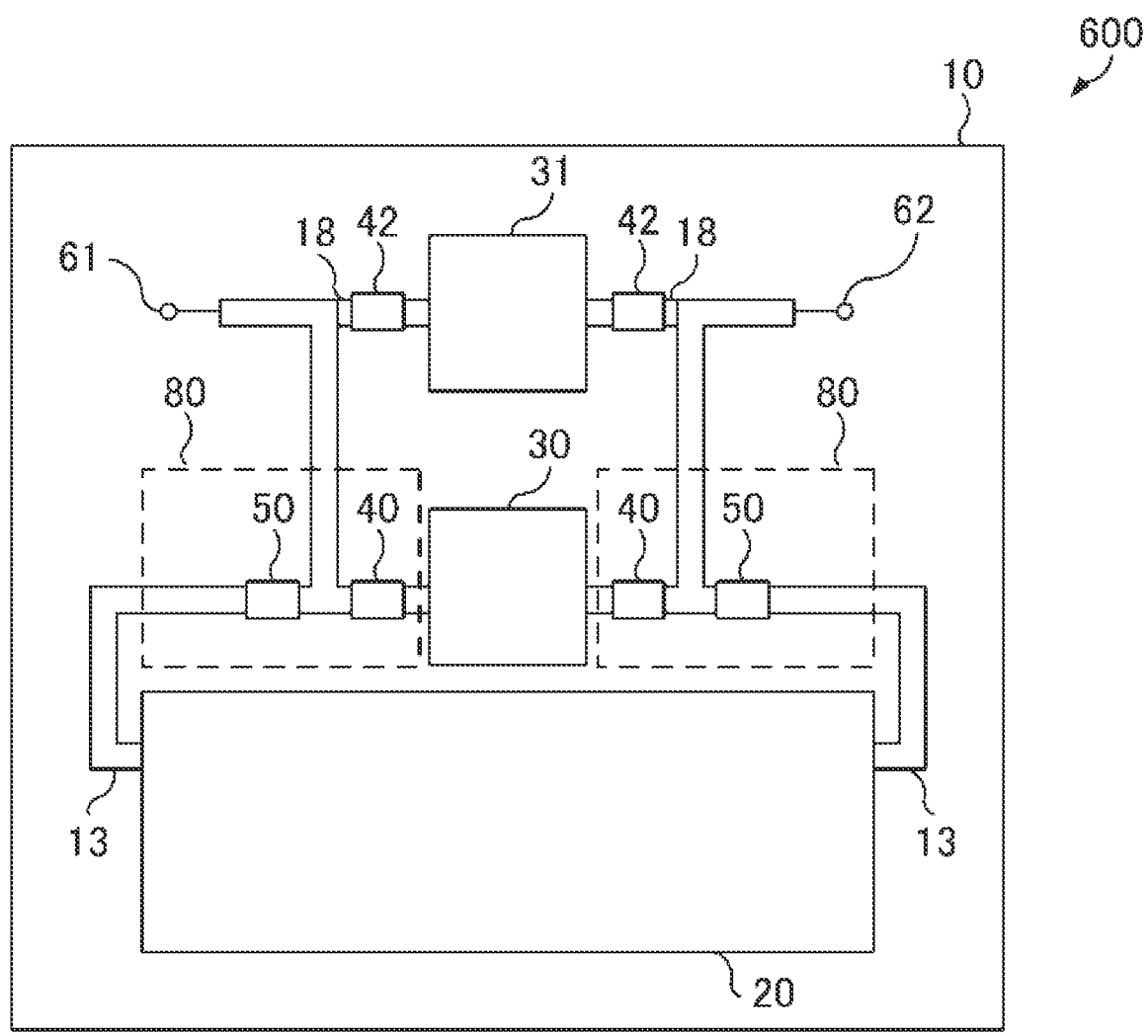
FIG. 7 is a schematic diagram showing an example of a multiband filter in Embodiment 5 of the present invention.

FIG. 7 is a schematic diagram showing an example of the multiband filter in Embodiment 5 of the present invention. In FIG. 7, the multiband filter 600 has a structure in which signal line conductor patterns 18, the filter 31, and the capacitors 42 are added between the capacitors 40 and the inductors 50 of the multiband filter 100 in Embodiment 1.

Here, because a printed circuit board 10, ground through holes 12, signal line conductor patterns 13, a filter 20, a filter 30, capacitors 40, inductors 50, an input terminal 61, and an output terminal 62 are the same as those of the multiband filter 100, an explanation of the parts will be omitted. Further, because a cross-sectional view showing a connection relation between each of the parts and the printed circuit board 10 is also the same as that of the multiband filter 100, an explanation of the relation will be omitted. Therefore, an illustration of ground conductor patterns 11, the ground through holes 12 below the filter 20, and pieces of solder 14 is omitted. Although the added filter is only the filter 31 for the sake of explanation, the embodiments are not limited to this example, and the number of added filters 31 can be set up arbitrarily.

In FIG. 7, the signal line conductor patterns 18 branch from the signal line conductor patterns 13 arranged between the capacitors 40 and the inductors 50, and form transmission lines together with the ground conductor patterns 11, like the signal line conductor patterns 13. The transmission lines formed by the signal line conductor patterns 18 correspond to fourth transmission lines. Although in FIG. 7, the signal line conductor patterns 18 are illustrated separately from the signal line conductor patterns 13 for the sake of explanation, the signal line conductor patterns 18 can be constituted integrally with the signal line conductor patterns 13.

In FIG. 7, the filter 31 has the same outer dimension as the filter 30, and its passband frequencies differ from those of the filters 20 and 30 and are higher than those of the filter 30. The filter 31 is connected to the signal line conductor patterns 18 branching from the signal line conductor patterns 13 arranged between the capacitors 40 and the inductors 50, and is connected in parallel to the filters 20 and 30. The filter 31 corresponds to a third filter.

The capacitors 42 are connected to the signal line conductor patterns 18, and are connected in series to the filter 31. The capacitors 42 correspond to third capacitors. Although the case in which the two capacitors 42 are arranged in the multiband filter 600 is explained, the embodiments are not limited to this example, and one or three or more capacitors 42 can be arranged.

Because the multiband filter 600 has the three filters connected in parallel and arranged therein, the multiband filter can provide three passbands. Further, because a part of the multiband filter 600 has the same structure as the multiband filter 100 of Embodiment 1, the multiband filter 600 can achieve both the formation of the passbands and the attainment of an amount of attenuation in a suppression band outside the passbands, like the multiband filter 100.

As mentioned above, according to the multiband filter 600 of Embodiment 5, the number of filters connected in parallel is three by virtue of the addition of a filter between the capacitors 40 and the inductors 50, and there is provided an advantage of being able to provide three passbands.

Although the case in which the number of added filters is one in the multiband filter 600 is explained, the embodiments are not limited to this example, and two or more filters can be added. In the case in which two or more filters are added, the number of filters connected in parallel is four or more, and there is provided an advantage of being able to provide the multiband filter with four or more passbands.

Although the case in which the added filter 31 has the same outer dimension as the filter 30 in the multiband filter 600 is explained, the embodiments are not limited to this example, and the outer dimensions of the added filter and the filter 30 can differ. In this case, by arranging the signal line conductor patterns 18 in areas which are formed on the printed circuit board 10 by virtue of the difference between the outer dimensions of the filters 30 and 31, like those formed by the filters 20 and 30, in accordance with the relation between the passband frequencies of the filters 30 and 31, i.e., by forming the transmission line for a filter having low passband frequencies into a long one, the attainment of an amount of attenuation in the suppression band outside the passbands can be implemented.

Although the case in which the added filter 31 has passband frequencies higher than those of the filter 30 in the multiband filter 600 is explained, the embodiments are not limited to this example, and the added filter can have passband frequencies lower than those of the filter 30. In this case, by adding inductors instead of the capacitors 42 and connecting the filters 20, 30, and 31 in parallel, there is provided an advantage of being able to provide three passbands. The inductors added instead of the capacitors 42 correspond to third inductors.

Embodiment 6

In Embodiment 6, an embodiment of a multiband filter in which a filter 32 and inductors 52 are added to the multiband filter 100 in Embodiment 1 and which includes three filters will be explained.

Figure 8:
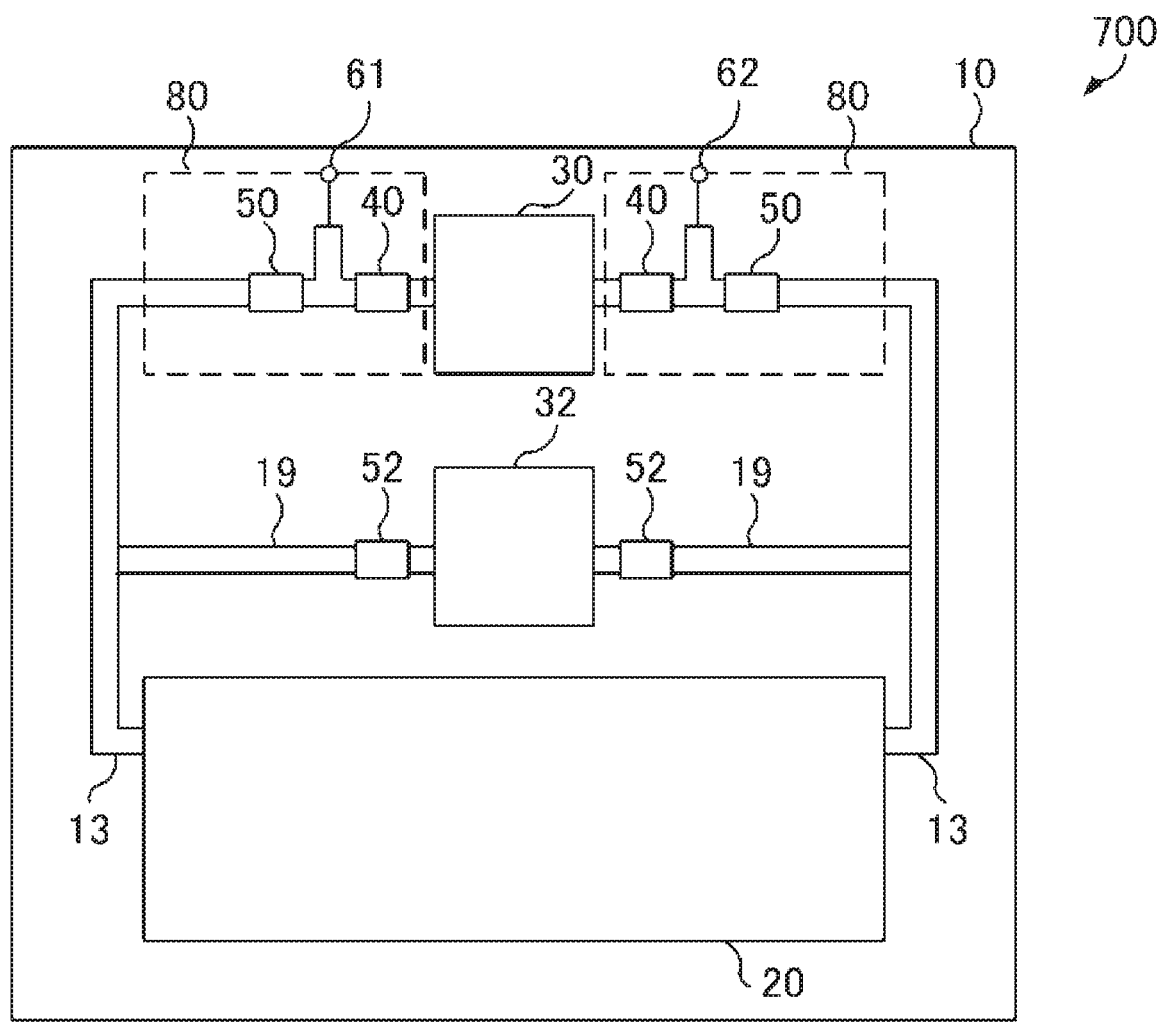
FIG. 8 is a schematic diagram showing an example of a multiband filter in Embodiment 6 of the present invention.

FIG. 8 is a schematic diagram showing an example of the multiband filter in Embodiment 6 of the present invention. In FIG. 8, the multiband filter 700 has a structure in which signal line conductor patterns 19, the filter 32, and the inductors 52 are added between the filter 20 and the inductors 50 of the multiband filter 100 in Embodiment 1.

Here, because a printed circuit board 10, ground through holes 12, signal line conductor patterns 13, a filter 20, a filter 30, capacitors 40, inductors 50, an input terminal 61, and an output terminal 62 are the same as those of the multiband filter 100, an explanation of the parts will be omitted. Further, because a cross-sectional view showing a connection relation between each of the parts and the printed circuit board 10 is also the same as that of the multiband filter 100, an explanation of the relation will be omitted. Therefore, an illustration of ground conductor patterns 11, the ground through holes 12 below the filter 20, and pieces of solder 14 is omitted. Although the added filter is only the filter 32 for the sake of explanation, the embodiments are not limited to this example, and the number of added filters 32 can be set up arbitrarily.

In FIG. 8, the signal line conductor patterns 19 branch from the signal line conductor patterns 13 arranged between the filter 20 and the inductors 50, and form transmission lines together with the ground conductor patterns 11, like the signal line conductor patterns 13. The transmission lines formed by the signal line conductor patterns 19 correspond to fifth transmission lines. Although in FIG. 8, the signal line conductor patterns 19 are illustrated separately from the signal line conductor patterns 13 for the sake of explanation, the signal line conductor patterns 19 can be constituted integrally with the signal line conductor patterns 13.

In FIG. 8, the filter 32 has the same outer dimension as the filter 30, and has passband frequencies different from those of the filters 20 and filter 30 and lower than those of the filter 30. The filter 32 is connected to the signal line conductor patterns 19 branching from the signal line conductor patterns 13 arranged between the filter 20 and the inductors 50, and is connected in parallel to the filters 20 and 30. The filter 32 corresponds to a third filter.

The inductors 52 are connected to the signal line conductor patterns 19, and are connected in series to the filter 32. The inductors 52 correspond to fourth inductors. Although the case in which the two inductors 52 are arranged in the multiband filter 700 is explained, the embodiments are not limited to this example, and one or three or more inductors 52 can be arranged.

Because the multiband filter 700 has the three filters connected in parallel and arranged therein, the multiband filter can provide three passbands. Further, because a part of the multiband filter 700 has the same structure as the multiband filter 100 of Embodiment 1, the multiband filter 700 can achieve both the formation of the passbands and the attainment of an amount of attenuation in a suppression band outside the passbands, like the multiband filter 100.

As mentioned above, according to the multiband filter 700 of Embodiment 6, the number of filters connected in parallel is three by virtue of the addition of a filter between the filter 20 and the inductors 50, and there is provided an advantage of being able to provide three passbands.

Although the case in which the number of added filters is one in the multiband filter 700 is explained, the embodiments are not limited to this example, and two or more filters can be added. In the case in which two or more filters are added, the number of filters connected in parallel is four or more, and there is provided an advantage of being able to provide the multiband filter with four or more passbands.

Although the case in which the added filter has the same outer dimension as the filter 30 in the multiband filter 700 is explained, the embodiments are not limited to this example, and the outer dimensions of the filters 32 and 30 can differ. In this case, by arranging the signal line conductor patterns 19 in areas which are formed on the printed circuit board 10 by virtue of the difference between the outer dimensions of the filters 30 and 32, like those formed by the filters 20 and 30, in accordance with the relation between the passband frequencies of the filters 30 and 32, i.e., by forming the transmission line for a filter having low passband frequencies into a long one, the attainment of an amount of attenuation in the suppression band outside the passbands can be implemented.

Although the case in which the added filter is added between the filter 20 and the inductors 50 in the multiband filter 700 is explained, the embodiments are not limited to this example, and the added filter can be added between the capacitors 40 and the inductors 50, like in the case of the multiband filter 600 of Embodiment 5.

Figure 9:
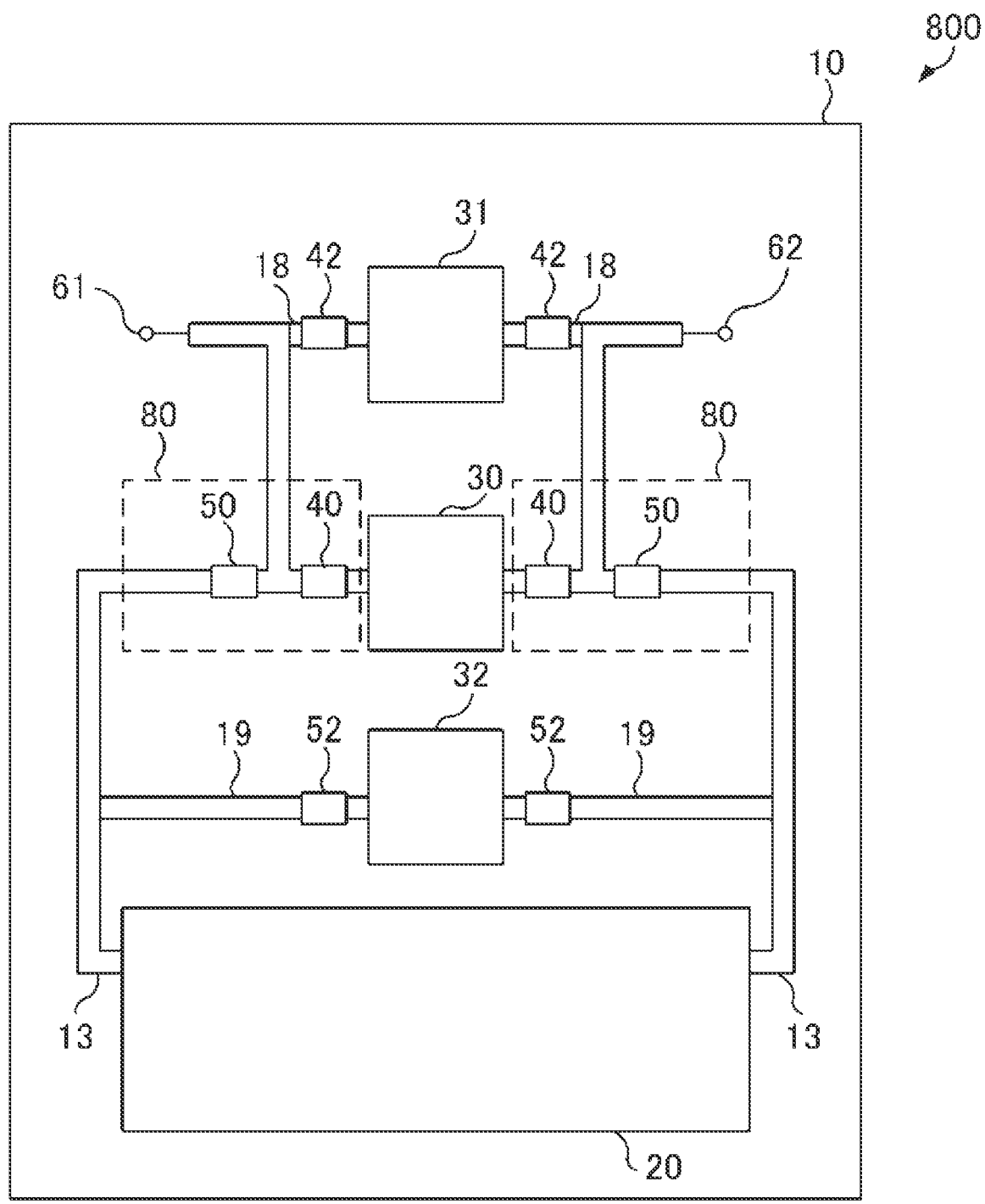
FIG. 9 is a schematic diagram showing an example of the multiband filter in Embodiment 6 of the present invention.

A multiband filter 800 in which signal line conductor patterns 18, a filter 32, and inductors 52 are added between a filter 20 and inductors 50, and signal line conductor patterns 19, a filter 31, and capacitors 42 are added between capacitors 40 and inductors 50 will be explained using FIG. 9. FIG. 9 is a schematic diagram showing an example of the multiband filter in Embodiment 6 of the present invention.

Here, because a printed circuit board 10, ground through holes 12, signal line conductor patterns 13, the signal line conductor patterns 18, the signal line conductor patterns 19, the filter 20, a filter 30, the filter 31, the filter 32, the capacitors 40, the capacitors 42, the inductors 50, the inductors 52, an input terminal 61, and an output terminal 62 are the same as those of the multiband filter 100 of Embodiment 1, those of the multiband filter 600 of Embodiment 5, and those of the multiband filter 700 of Embodiment 6, an explanation of the parts will be omitted. Further, because a cross-sectional view showing a connection relation between each of the parts and the printed circuit board 10 is also the same as that of the multiband filter 100 of Embodiment 1, an explanation of the relation will be omitted. Therefore, an illustration of ground conductor patterns 11, the ground through holes 12 below the filter 20, and pieces of solder 14 is omitted. Although the added filters are only the two filters 31 and 32 for the sake of explanation, the embodiments are not limited to this example, and the number of added filters can be set up arbitrarily.

In FIG. 9, in the multiband filter 800, by arranging the filter 31 and the capacitors 42 between the capacitors 40 and the inductors 50, like in the case of the multiband filter 600 of Embodiment 5, and arranging the filter 32 and the inductors 52 between the filter 20 and the inductors 50, like in the case of the multiband filter 700 of Embodiment 6, the filters 20, 30, 31, and 32 are connected in parallel.

Because the multiband filter 800 has the four filters connected in parallel and arranged therein, the multiband filter can provide four passbands. Further, because a part of the multiband filter 800 has the same structure as the multiband filter 100 of Embodiment 1, the multiband filter 800 can achieve both the formation of the passbands and the attainment of an amount of attenuation in a suppression band outside the passbands, like the multiband filter 100.

REFERENCE SIGNS LIST

100, 200, 300, 400, 500, 600, 700, 800, 900 multiband filter, 10 printed circuit board, 11 ground conductor pattern, 12 ground through hole, 13, 15, 16, 18, 19 signal line conductor pattern, 14 solder, 17 signal line short circuiting conductor pattern, 20, 30, 31, 32 filter, 40, 41, 42 capacitor, 50, 51, 52 inductor, 61 input terminal, and 62 output terminal.

What is claimed is:

1. A multiband filter comprising:
    a printed circuit board on which parts are arranged;
    a first filter installed on the printed circuit board;
    a second filter having an outer dimension different from that of the first filter and passband frequencies higher than those of the first filter, and installed on the printed circuit board;
    an input terminal to which a signal is inputted from an outside;
    an output terminal via which a signal is outputted to an outside;
    at least one first inductor arranged in a space between the input terminal and the first filter, or a space between the output terminal and the first filter;
    at least one first capacitor arranged in a space between the input terminal and the second filter, or space between the output terminal and the second filter; and
    signal line conductor patterns for connecting the first filter, the input terminal, the output terminal, and the first inductor, to form a first transmission line, and also connecting the second filter, the input terminal, the output terminal, and the first capacitor, to form a second transmission line, a part thereof belonging to the first transmission line being arranged in an area on the printed circuit board, the area being formed by a difference between the outer dimensions of the first and the second filters.

2. The multiband filter according to claim 1, wherein the first transmission line is longer than the second transmission line.

3. The multiband filter according to claim 1, wherein the first filter is larger than the second filter, and the second filter, the first inductor, and the first capacitor are arranged in a row along an identical direction.

4. The multiband filter according to claim 1, wherein the second filter is larger than the first filter.

5. The multiband filter according to claim 1, wherein a signal line conductor pattern connecting the first filter and the first inductor has lower impedance than that of another signal line conductor pattern.

6. The multiband filter according to claim 1, further comprising:
    a signal line short circuiting conductor pattern for forming a short circuit part short-circuited to a ground; and
    a second capacitor connected to the short circuit part, and wherein a signal line conductor pattern is connected to the second capacitor and forms a third transmission line branching from the first transmission line.

7. The multiband filter according to claim 6, further comprising: a second inductor arranged between a branch point between the first transmission line and the third transmission line, and the first filter, and connected in series to the first inductor.

8. The multiband filter according to claim 6, wherein the signal line conductor pattern forming the third transmission line, the short circuit part, and the second capacitor are arranged inside an area surrounded by the first and the second transmission lines, and the first and the second filters.

9. The multiband filter according to claim 1, further comprising: a fourth transmission line formed by a signal line conductor pattern branching from a signal line conductor pattern arranged between the first capacitor and the first inductor; a third filter arranged in such a way as to be connected to the fourth transmission line and having passband frequencies higher than those of the second filter; and a third capacitor connected to the third filter.

10. The multiband filter according to claim 1, further comprising: a fourth transmission line formed by a signal line conductor pattern branching from a signal line conductor pattern arranged between the first capacitor and the first inductor; a third filter arranged in such a way as to be connected to the fourth transmission line, and having passband frequencies different from those of the first and second filters and lower than those of the second filter; and a third inductor connected to the third filter.

11. The multiband filter according to claim 1, further comprising: a fifth transmission line formed by a signal line conductor pattern branching from a signal line conductor pattern arranged between the first inductor and the first filter; a third filter arranged in such a way as to be connected to the fifth transmission line, and having passband frequencies different from those of the first and second filters and lower than those of the second filter; and a fourth inductor connected to the third filter.

12. The multiband filter according to claim 1, comprising two first inductors, one arranged in the space between the input terminal and the first filter, and one arranged in the space between the output terminal and the first filter.

13. The multiband filter according to claim 1, comprising two first capacitors, one arranged in the space between the input terminal and the second filter, and one arranged in the space between the output terminal and the second filter.

\* \* \* \* \*